US006693933B2

(12) United States Patent
Strzelecki

(10) Patent No.: US 6,693,933 B2
(45) Date of Patent: Feb. 17, 2004

(54) VERTICAL CAVITY MASTER OSCILLATOR POWER AMPLIFIER

(75) Inventor: Eva M. Strzelecki, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/809,532

(22) Filed: Mar. 15, 2001

(65) Prior Publication Data

US 2002/0131461 A1 Sep. 19, 2002

(51) Int. Cl.$^7$ ................................................ H01S 5/00
(52) U.S. Cl. ............................................ 372/43; 257/11
(58) Field of Search ............................. 372/43, 45, 75, 372/36, 50; 257/11

(56) References Cited

U.S. PATENT DOCUMENTS

| | | | |
|---|---|---|---|
| 4,575,849 A | | 3/1986 | Chun |
| 4,698,816 A | | 10/1987 | Chun |
| 5,132,982 A | * | 7/1992 | Chan et al. ............... 257/197 |
| 5,363,390 A | | 11/1994 | Yang et al. |
| 5,414,726 A | | 5/1995 | Raj et al. |

(List continued on next page.)

OTHER PUBLICATIONS

Cho, S.H. et al., "1.9–W Quasi–CW from a Near–Diffraction–Limited 1.55–μm InGaAsP–InP Tapered Laser", *IEEE Photonics Technology Letters*, vol. 10, No. 8, pp. 1091–1092 (Aug. 1998).
Coldren, L. et al., "VCSELs in '98: What we have and what we can expect", *SPIE*, vol. 3286, pp. 2–16 (Date unknown).
Fiedler, U. et al., "Hybrid Integrated VCSEL–Fiber Module for Efficient Mode Locking", *LEOS '94 Conference Proceedings*, vol. 1, pp. 284–285 (1994).
Kim, J.K., et al., "Epitaxially–stacked multiple–active–region 1.55 μm lasers for increased differential efficiency", *Applied Physics Letters*, vol. 74, No. 22, pp. 3251–3253 (May 31, 1999).
Izhaky, N. et al., "Analysis of DBR Lasers and MOPA with Saturable Absorption Gratings", *IEEE Journal of Qantum Electronics*, vol. 33, No. 7, pp. 1149–1155 (Jul. 1997).
Jost, G. et al., "3 Gb/s High–Power Optical Data Transmission System", *SBMO/IEEE MTT–S IMOC'99 Proceedings*, pp. 193–195 (1999).
Lang, R. et al., "Numerical Analysis of Flared Semiconductor Laser Amplifiers", *IEEE Journal of Quantum Electronics*, vol. 29, No. 6, pp. 2044–2051 (Jun. 1993).
O'Brien, S. et al., "2.2–W Continuous–Wave Diffraction–Limited Monolithically Integrated Master Oscillator Power Amplifier at 854 nm", *IEEE Photonics Technology Letters*, vol. 9, No. 4, pp. 440–442 (Apr. 1997).

(List continued on next page.)

*Primary Examiner*—Paul Ip
*Assistant Examiner*—Hung Vy
(74) *Attorney, Agent, or Firm*—Andrew A. Abeyta

(57) ABSTRACT

In accordance with the invention, there is provided a device having a first portion with at least one quantum well, where the first portion emits light, a spacer layer, and a second portion with an amplifying region with at least one quantum well, where the device is configured so that the spacer layer transmits the light beam emitted by the first portion and the amplifying region increases the intensity of the light beam. In accordance with another aspect of the invention, there is provided a method of manufacturing a vertical cavity surface emitting laser having the steps of, forming a first portion, having at least one quantum well, that emits light, forming a spacer layer made of a material that is transmissive of light emitted from the first portion, forming a second portion having at least one quantum well, where the second portion is positioned over the spacer layer and the spacer layer is positioned over the first portion.

24 Claims, 7 Drawing Sheets

U.S. PATENT DOCUMENTS

| | | | |
|---|---|---|---|
| 5,436,759 A | | 7/1995 | Dijaili et al. |
| 5,475,701 A | | 12/1995 | Hibbs-Brenner |
| 5,568,574 A | | 10/1996 | Tanguay, Jr. et al. |
| 5,604,628 A | | 2/1997 | Parker et al. |
| 5,802,084 A | | 9/1998 | Bowers et al. |
| 5,861,550 A | | 1/1999 | Ray |
| 5,892,786 A | | 4/1999 | Lott |
| 5,893,722 A | * | 4/1999 | Hibbs-Brenner et al. ..... 372/45 |
| 6,031,243 A | * | 2/2000 | Taylor ......................... 257/13 |
| 6,040,587 A | * | 3/2000 | Kishino et al. ............... 257/11 |
| 6,052,398 A | | 4/2000 | Brillouet et al. |
| 6,054,726 A | | 4/2000 | Ogihara et al. |
| 6,075,805 A | | 6/2000 | Cook et al. |
| 6,088,376 A | | 7/2000 | O'Brien et al. |
| 6,096,496 A | | 8/2000 | Frankel |

OTHER PUBLICATIONS

Suzuki, N. et al., "Feasibility Study of an Optical Bus Utilizing InGaAsP Vertical Transmission Optical Amplifiers", *IEEE Photonics Technology Letters*, vol. 8, No. 8, pp. 1100–1102(Aug. 1996).

Tombling, C. et al., "Performing Predictions for Vertical–Cavity Semiconductor Laser Amplifiers", *IEEE Journal of Quantum Electronics*, vol. 30, No. 11, pp. 2491–2499 (Nov. 1994).

Uemukai, M. et al., "Monolithically Integrated InGaAs–AlGaAs Master Oscillator Power Amplifier with Grating Outcoupler", *IEEE Photonics Technology Letters*, vol. 10, No. 8, pp. 1097–1099 (Aug. 1998).

* cited by examiner

VERTICAL CAVITY MASTER OSCILLATOR POWER AMPLIFIER

FIELD OF THE INVENTION

The invention relates generally to methods of improving surface emitting lasers. More specifically, the invention relates to methods of assembling amplified vertical cavity surface emitting lasers (VCSELs) and the devices resulting therefrom.

BACKGROUND OF THE INVENTION

Vertical cavity surface emitting lasers (VCSELs) are becoming an important component in electrical devices. VCSELs are becoming the component of choice for numerous applications, supplanting other types of lasers in a number of applications including data communication, optical interconnections and memory, sensors, printers, etc. The success of VCSELs is a direct result of the novel vertical geometry. The vertical geometry gives VCSELs a number of their advantageous operating characteristics, especially including significantly lower operating currents (to the mA range) and power dissipation/emission (to the mW/s) at Gbit data rates; high reliability ($>10^7$ Hrs MTTF), wafer-level batch fabrication and testing, and utilization of the existing LED (Light Emitting Diode) infrastructure; increased fiber coupling efficiency (>90%), and simplified drive electronics, all of which translate into a significant cost savings. VCSELs are also extremely useful because they emit power at a discrete wavelength; they have a single longitudinal mode, and can be made to have a single spatial mode.

Although VCSELs offer a number of significant advantages for their relatively low cost of production, they are not without their disadvantages. One of the disadvantages of VCSELs is their low single-mode power output. One solution to this problem is to make the diameter of the laser beam bigger. A larger laser would have a higher power output. However, when VCSELs are made larger, they no longer have a single spatial mode, but produce multiple spatial modes, each having different wavelength peaks. Therefore, for applications that require small focal spots or single mode fibers, it would be desirable to have a VCSEL with greater power output that still maintains its single spatial mode and high modulation bandwidth.

A number of references disclose methods of increasing power output of a VCSEL, including Jost, G. et al., *SBMO/IEEE MTT-S IMOC '99 Proceedings*, p. 193 (1999); Vemukai, M. et al., *IEEE Photonics Technology Letters*, 10 (8) (1998); and Izhaky, N., *IEEE Jrnl. Of Quantum Elecs.* 33 (7) (1997). The apparatuses disclosed their function to produce a laser beam that has been amplified from its original power. However, because of the way that the beam was amplified the resulting laser beam is asymmetric.

Therefore, there exists a need for an amplified vertical cavity surface emitting laser that retains a single spatial mode, a high modulation bandwidth is symmetric. VCSELs with these characteristics would also be advantageous for use in two-dimensional arrays.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The invention provides both devices and methods of manufacture. In accordance with one aspect of the invention a device is provided with a first portion that emits light that has at least one quantum well, a spacer layer, and a second portion with an amplifying region with at least one quantum well, where the device is configured so that the spacer layer transmits the light beam emitted by the first portion and the amplifying region increases the intensity of the light beam. The spacer layer can be made of any material that is transmissive of the light emitted from the first portion, including semiconductor material, dielectric material, or a gap.

In accordance with another aspect of the invention, a method of manufacturing a vertical cavity surface emitting laser is provided having the steps of forming a first portion that emits light with at least one quantum well, forming a spacer layer made of a material that is transmissive of light emitted from the first portion, forming a second portion having at least one quantum well, where the second portion is positioned over the spacer layer and the spacer layer is positioned over the first portion. The device can be manufactured in a number of ways, including on one substrate by epitaxial growth, or on two different substrates that are later secured together with the spacer layer in between.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

It should be understood that the drawings are not necessarily to scale and that the embodiments are illustrated using graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PREFERRED EMBODIMENT

The invention includes VCSELs and methods of producing the same. The VCSELs of the invention comprise a substrate, a first portion, a spacer layer, and a second portion. The method of the invention comprises growing the first portion of the VCSEL, forming a spacer layer, and growing the second portion of the VCSEL.

DEVICE

Figure 1:
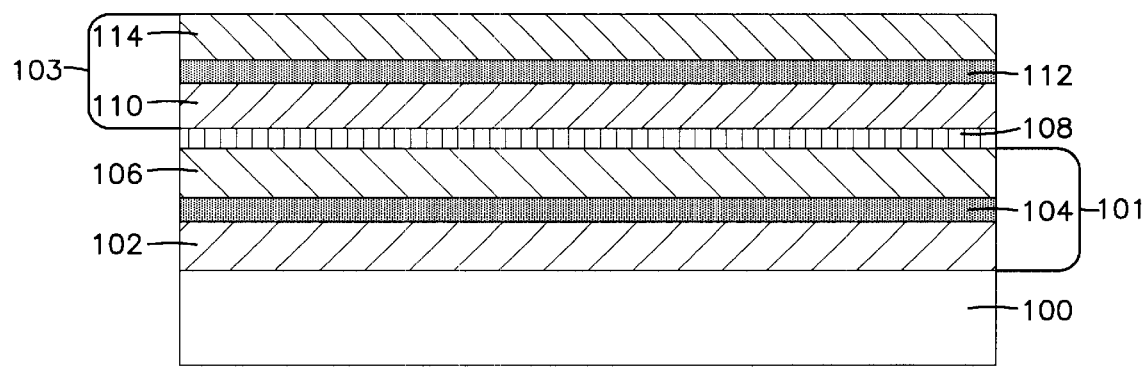
FIG. 1 is a cross-section of a device in accordance with the invention.

FIG. 1 is a sectional view, and it should therefore be appreciated that the illustration depicted in FIG. 1 can extend into and out of the drawings, thereby allowing for the depiction of arrays of the structure. FIG. 1 illustrates a device in accordance with one aspect of the invention. FIG. 1 is a cross sectional view of such an exemplary device. As seen in FIG. 1, a device in accordance with the invention comprises several elements including substrate 100, first portion 101, spacer layer 108, and second portion 103. The exemplary device that is discussed herein is based on a GaAs laser with an emission at 850 nm. This specific device is offered as an example, and the invention is in no way limited to devices that emit light at 850 nm. Other wavelengths to which the present invention is applicable, include, without limitation, 650 nm, 780 nm, and 1300 nm.

Generally, substrate 100 is made of any suitable semiconductor material, such as gallium arsenide, silicon, indium phosphide, or the like. Preferably, substrate 100 is made of gallium arsenide, which facilitates the growth of additional layers of gallium arsenide or derivatives thereof. Substrate 100 is generally from about 250 to 1000 $\mu$m thick. Preferably, substrate 100 is from 500 to 700 $\mu$m thick. More preferably, the substrate 100 is from 600 to 650 $\mu$m thick, e.g. 625 $\mu$m thick.

Positioned on substrate 100 is a first portion 101. First portion 101 comprises first bottom Distributed Bragg Reflectors (or DBR) stack 102, active region 104, and first top DBR stack 106. First portion 101 functions as the light source in a device of the invention. Generally, first portion 101 can comprise any VCSEL device known to those of skill in the art. Components, and the specific configuration of first bottom DBR stack 102 will depend on the ultimate use of the device.

First portion 101, which is at least similar to VCSEL devices known to those of skill in the art, is typically energized by an electrical current from a power supply (not shown). The current is applied to first portion 101 through electrical contacts (not shown) in any convenient configuration of a kind generally used in conventional VCSELs. Active region 104 of first portion 101 is most simply made of at least one quantum well with barrier regions on either side of the quantum well(s), this configuration causes the propagation of light, when energized as discussed above. Because of the small size of active region 104, the photons do not experience significant gain as they propagate through the cavity, therefore first bottom DBR stack 102 and first top DBR stack 106 function to create a coherent reflection of light from the active region 104.

Examples of VCSELs that can be utilized as first portion 101 can be found in U.S. Pat. No. 5,893,722 ("Hibbs-Brenner et al."), U.S. Pat. No. 5,475,701 ("Hibbs-Brenner"), and Coldren, L, et al., SPIE 3286, pp. 2–16, all of which are incorporated herein by reference. A specific example of first bottom DBR stack 102, active region 104, and first top DBR stack 106 will be given for first portion 101 that emits light at a wavelength of for example 850 nm.

Figure 2:
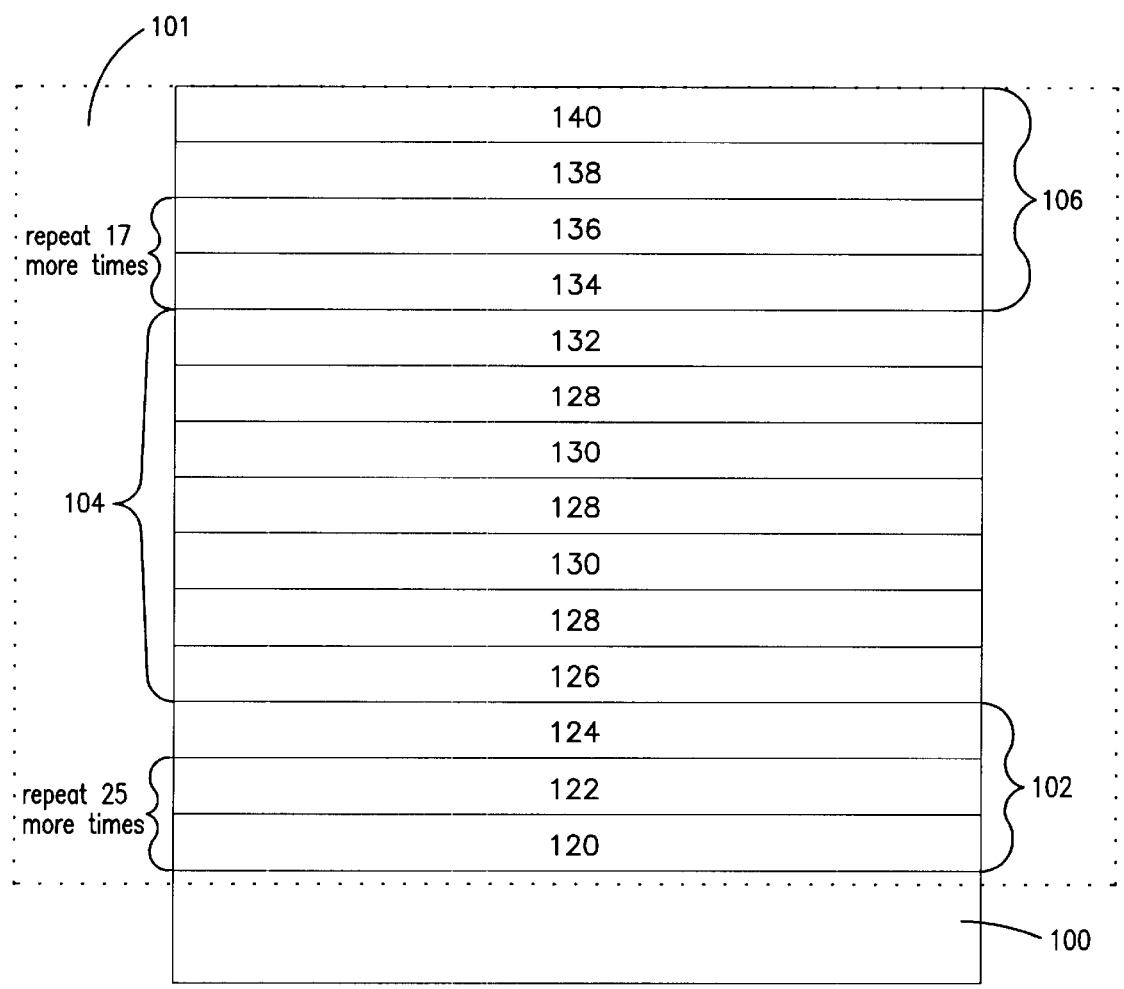
FIG. 2 depicts a cross-section of the individual layers of first portion 101.

Referring to FIG. 2, a specific exemplary configuration for first bottom DBR stack 102, which is situated on substrate 100, comprises layers 120, 122 (preferably repeated a total of about 26 times for a 850 nm laser) and 124. First bottom DBR stack 102 begins with a 60.5 nanometers (nm) layer of undoped $Al_{0.15}Ga_{0.85}As$ material, layer 120. Situated on top of that is a 71.1 nm layer of undoped AlAs, layer 122. The thickness of these layers is dictated by $\lambda/4n$ where $\lambda$ is the wavelength (850 nm) and n is the index of refraction of the layer. In this instance, layers 120 and 122 are repeated for a total of about 26 alternating layer pairs. Positioned on top of the 26 alternating layers is a layer of p-doped $Al_{0.15}Ga_{0.85}As$, layer 124.

An exemplary configuration of active region 104, which is situated on first bottom DBR stack 102, comprises layers 126, 128, 130, 128, 130, 128, and 132. Active region 104 can comprise an undoped $Al_{0.25}Ga_{0.75}As$ layer of appropriate thickness, layer 126. Positioned on top of layer 126 is first layer 128 of undoped GaAs. Next is first layer 130 of $Al_{0.25}Ga_{0.75}As$. Situated on layer 130, is second layer 128 of undoped GaAs. Positioned on second layer 128 is second layer 130 of $Al_{0.25}Ga_{0.75}As$. Situated on second layer 130 is third layer 128 of undoped GaAs. On third layer 128 is layer 132 of undoped $Al_{0.25}Ga_{0.75}As$.

An exemplary configuration of first top DBR stack 106, which is situated on top of active region 104, can comprise repeating layers 134 and 136, layer 138, and layer 140. First top DBR stack 106 begins with layer 134, which can be an n-doped AlAs layer. Positioned on layer 134 is another n-doped $Al_{0.15}Ga_{0.85}$, layer 136. Layers 134 and 136 are repeated for a total of about 18 alternating layer pairs. An n-doped AlAs, layer 138 is then formed. Positioned on layer 138 is a layer of n-doped $Al_{0.15}Ga_{0.85}As$, layer 140.

Alternatively, first portion 101 can include a number of different configurations of standard VCSEL devices. Examples include, but are not limited to, VCSEL devices with non-conducting mirrors and intracavity contacts, VCSEL devices with dielectric mirrors, and VCSEL devices with top and bottom conducting mirrors.

Spacer layer 108 is situated on top of first portion 101. Spacer layer 108 is transparent to the light emitted by first portion 101, and functions in part to expand the light emitted from first portion 101. Spacer layer 108 can be formed of any material that is transparent and can expand the beam of light emitted from first portion 101, such as a semiconductor material, a dielectric material, an air gap, or the like. The thickness of spacer layer 108 depends in part on the material of first portion 101, the aperture diameter of first portion 101 (in particular the width of the beam exiting the first portion 101), the material of spacer layer 108 (its refractive index in particular), and the specified width of the beam entering the second portion 103. Generally, spacer layer 108 is from about 1 to 500 $\mu$m thick. Preferably, spacer layer 108 is from about 10–100 $\mu$m thick. The construction and manufacture of the device will also depend in part on the material making up the spacer layer 108.

The thickness of spacer layer 108 is determined in the following manner. Assuming, for purposes of example, that a small laser device with a beam radius of 0.5 $\mu$m is to be expanded to a beam of 5 $\mu$m. If air is used as spacer layer 108, there is about a 13 to 18° angle of divergence. If, in the alternative, a polymer with a refractive index of about 1.6 is used as spacer layer 108, there is about a 7 to 10° angle of divergence. A semiconductor with a refractive index of about 3.3 would result in an angle of divergence of about 3 to 5°. Therefore, based on the geometry of the beam, spacer layer 108 would be about 15 to 25 µm of air, 25 to 45 µm of a polymer, and 60 to 100 µm if a semiconductor.

In accordance with one embodiment of the device, spacer layer 108 is formed from semiconductor material. Spacer layer 108 can be formed from the same or different materials than first portion 101, as long as the material chosen is transparent to the light emitted by first portion 101. For example, if the aperture diameter of first portion 101 was about 1 µm, and the light beam from first portion 101 is to be expanded to about 10 µm, then the semiconductor material making up spacer layer 108 would be from about 60 to 100 µm thick.

In accordance with another embodiment of the invention, spacer layer 108 is formed by creating a gap between first portion 101 and second portion 103. This can be accomplished by any method known to those of skill in the art, such as applying adhesive, solder, or a fixed spacer or standoff as is normally used in the art to attach semiconductor devices to one another, and leaving the area directly above the aperture of first portion 101 free of the material. This configuration then creates a gap that is filled with air, which makes up spacer layer 108. Alternatively, if a fixed spacer or standoff is utilized, the gap could be filled with a dielectric. This would allow for use of a polymer as the dielectric, while still being able to create a defined depth of the polymer. The light emitted from first portion 101 is then transmitted through the air in the gap before it reaches second portion 103. For example, if the aperture of first portion 101 was about 1 µm, and the light beam from first portion 101 is to be expanded to about 10 µm, then the gap making up spacer layer 108 would be from about 15 to 25 µm thick.

In accordance with yet another embodiment of the invention, the spacer layer 108 can be formed from a dielectric material. Any dielectric material commonly used can be utilized, as long as it is transparent to the light emitted from first portion 101, examples of which are silicon dioxide (SiO$_2$), spin on glass, or a polymer. The dielectric material can function solely as a transparent medium to expand the light beam from first portion 101, in which case, first portion 101 can be secured to spacer layer 108 and spacer layer 108 can be secured to second portion 103 by any means known to those of skill in the art, including an adhesive or by fusion bonding. Alternatively the dielectric material can also serve as an adhesive to attach first portion 101 and second portion 103. An example of a material making up the spacer layer 108 that functions as a transparent medium, and an adhesive, includes a polyimide optical adhesive, spin on glass or benzocyclobutene (BCB) for example. For example, if the aperture of first portion 101 was about 1 µm, and the light beam from first portion 101 is to be expanded to about 10 µm, then the dielectric material making up spacer layer 108 would be about 30 to 100 µm thick, depending on the refractive index of the specific dielectric material utilized.

Positioned on spacer layer 108 is second portion 103. Second portion 103 functions as an amplifier in a device of the invention. Second portion 103 is similar to first portion 101 in structure, but serve a different function. First portion 101 function to emit light, while second portion 103 function to amplify that emitted light. The characteristics of second portion 103 are similar to that of first portion 101 in that they both are made of bottom DBR stacks (102 and 110), an active and an amplifying region (104 and 112), and top DBR stacks (106 and 114). However, first portion 101 and second portion 103 are configured so that second portion 103 has lower reflectivity bottom and top DBR stacks 110 and 114 (compared to 102 and 104), a thicker amplifying region 112 (compared to the active region 104), and a larger aperture diameter. These relative characteristics contribute to be what make second portion 103 function to amplify the light output from first portion 101.

Second portion 103 comprises amplifying region 112. Preferably, second portion 103 further comprises second bottom DBR stack 110, and second top DBR stack 114. Generally, second portion 103 functions as discussed above, and can be similar to first portion 101. Second portion 103 is electrically driven similar to the way first portion 101.

Second bottom DBR stack 110 of second portion 103 can be generally similar to first bottom DBR stack 102 except that it has a lower overall reflectivity. As discussed above, first bottom DBR stack 102 is made up of layers of semiconductor material. The number of layers that make up first bottom DBR stack 102 can be different depending on the characteristics of the device. Generally, first bottom DBR stack 102 has from about 20 to 35 pairs of alternating layers. Reflectivity of DBR stacks is determined in part by the number of layers that make up the stack, and generally, bottom DBR stacks of standard VCSELs have a reflectivity of from about 95 to 100%, more likely from about 99 to 99.8%. The two DBR stacks in VCSELs and/or the second portion 103 have related reflectivities in that the side designed as the emission side has a lower reflectivity than the non-emission side.

Second bottom DBR stack 110 is similar to first bottom DBR stack 102, in that it is made up of a number of layers of semiconductor material. The number of layers that make up second bottom DBR stack 110 can be characterized in terms of the number of layers that make up first bottom DBR stack 102. Generally, second bottom DBR stack 110 has a reflectivity of from about 40 to 99%, preferably, from about 60 to 80%. The reflectivity relates directly to the number of layers present in the second bottom DBR stack 110. An example of numbers of layers in the first bottom DBR stack 102 and the second bottom DBR stack 110 in a device formed from AlGaAs is from about 25 to 35 layers in first bottom DBR stack 102 and from about 10 to 20 layers in second bottom DBR stack 110.

Situated on top of second top DBR stack 110 is amplifying region 112. Amplifying region 112 is similar to active region 104 in that it contains a number of quantum wells. The number of quantum wells in amplifying region 112 can be characterized in terms of the number of quantum wells in active region 104. Generally, there should be at least as many quantum wells in amplifying region 112 as there are in active region 104. Preferably, there are more quantum wells in amplifying region 112 than there are in active region 104. Theoretically, amplifying region 112 could have an infinite number of quantum wells, and could amplify the laser beam infinitely well. However, the number of quantum wells is determined, in part, by the ability of the quantum wells to propagate electrons through to the holes on the other side of the amplifying region. This limitation on the number of quantum wells in amplifying region 112 can be overcome by using multiple active regions. One method of creating multiple active regions can be seen in J. K. Kim *Applied Physics Letters,* 74(22) (1999), which is incorporated herein by reference. An example of the number of quantum wells in active region 104 and amplifying region 112 is 3 quantum wells in active region 104 and from 3 to 50 quantum wells in amplifying region 112. Preferably amplifying region 112 has from 5 to 10 quantum wells.

Second top DBR stack 114 is similar to first top DBR stack 106, in that it is made of semiconductor materials. The relationship between second top DBR stack 114 and first top DBR stack 106 are analogous to the relationship between second bottom DBR stack 110 and first bottom DBR stack 102.

An example of a specific configuration of second portion 103 that would function with the specific example of first portion 101 given above and discussed with respect to FIG. 2 is as follows.

Figure 3:
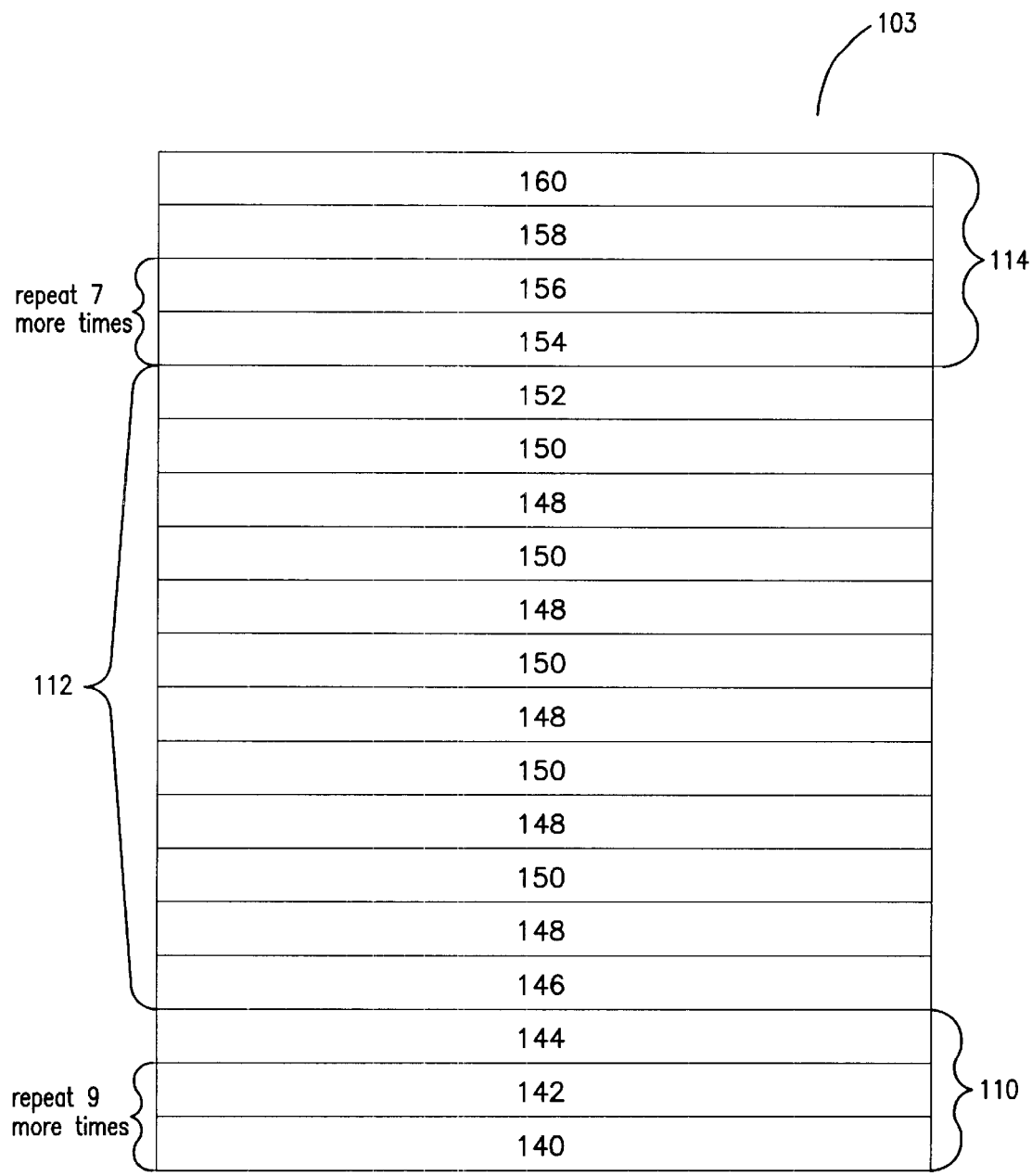
FIG. 3 is a cross-section of the individual layers of second portion 103.

Referring to FIG. 3, second bottom DBR stack 110, which in this illustrative example is grown on top of spacer layer 108, includes layers 140, 142, and 144. Second bottom DBR stack 110 begins with a 60.5 nanometers (nm) layer of undoped $Al_{0.15}Ga_{0.85}As$ material, layer 140. Situated on top of that is a 71.1 nm layer of undoped AlAs, layer 142. The thickness of these layers is dictated by $\lambda/4n$ where $\lambda$ is the wavelength (850 nm) and n is the index of refraction of the layer. For this specific example, layers 140 and 142 are repeated about 10 to 15 times, preferably about 10 times. Positioned on top of the alternating layer pairs is a layer of p-doped $Al_{0.15}Ga_{0.85}As$, layer 144.

Amplifying region 112, which is situated on second bottom DBR stack 110, comprises at least layers 146, 148, 150, and 152. In this specific example, layers 148 and 150 are repeated about five times, resulting in the formation of five quantum wells. Amplifying region 112 begins with layer 146, which is a undoped $Al_{0.25}Ga_{0.75}As$. The alternating layer pairs of 148 ad 150 follow. Layers 148 are undoped GaAs, and layers 150 are $Al_{0.35}Ga_{0.75}As$. Layer 152 follows the repeating layers of 148 and 150.

Second top DBR stack 114, which is situated on top of amplifying region 112, can comprise repeating layers 154 and 156, layer 158, and layer 160. In one preferred embodiment, layers 154 and 156 are repeated about 8 to 10 times, preferably about 8 times. In this preferred configuration, layers 154, are n-doped AlAs layers, layers 156 are n-doped $Al_{0.15}Ga_{0.85}$ layers, layer 158 is n-doped AlAs layer, and layer 160 is an n-doped $Al_{0.15}Ga_{0.85}As$ layer.

Alternatively, second portion 103 can include a number of different configurations of standard VCSEL devices. Generally, second portion 103 has an analogous configuration to first portion 101, however, analogous configurations are not required for a device to be made in accordance with the invention. Examples of configurations useful as second portion 103 include, but are not limited to VCSEL devices with non-conducting mirrors and intracavity contacts, VCSEL devices with dielectric mirrors, and VCSEL devices with top and bottom conducting mirrors.

Processing

The method of the invention comprises growing a first portion on a substrate, forming a spacer layer on said first portion, and growing a second portion either on a second substrate or on said spacer layer. Specific steps of the method will be exemplified by the exemplary process discussed below in reference to FIGS. 4 through 11.

FIGS. 4 through 11 depict an exemplary method in accordance with one aspect of the invention. FIGS. 4 through 11 are sectional views, and it should therefore be appreciated that the illustrations depicted in these figures can extend into and out of the drawings, thereby allowing for the depiction of production of arrays of the structure.

Figure 4:
FIGS. 4 through 11 depict fabrication of a device in accordance with the invention.

Referring to FIG. 4, substrate 100 is generally made of any suitable semiconductor material, such as gallium arsenide, silicon, indium phosphide, or the like. Preferably, substrate 100 is made of gallium arsenide, which facilitates the growth of additional layers of gallium arsenide or it's derivatives. Substrate 100 is generally from about 250 to 1000 $\mu$m thick. Preferably, substrate 100 is from 500 to 700 $\mu$m. More preferably, the substrate 100 is from 600 to 650 $\mu$m, e.g. 625 $\mu$m.

Figure 5:
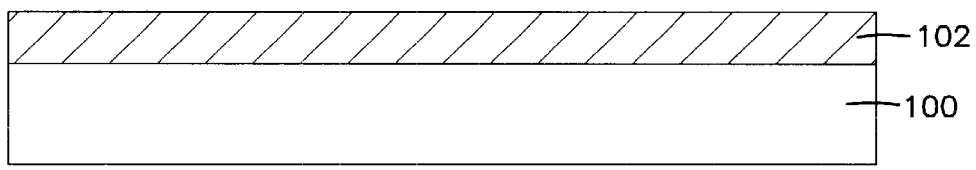

Referring to FIG. 5, the first step in producing a device of the invention is the growth of the first bottom DBR stack 102. As discussed above, in reference to the device of the invention, first bottom DBR stack 102 generally comprises a number of individual layers. The individual layers of first bottom DBR stack 102 are disposed or grown on substrate 100 by any suitable epitaxial method or technique such as Metal Organic Chemical Vapor Deposition (MOCVD), Molecular Beam Epitaxy (MBE), Chemical Beam Epitaxy (CBE), or the like. Preferably, the first bottom DBR stack 102 is deposited by MOCVD.

The first bottom DBR stack 102 can be formed of a number of materials, depending on the ultimate use of the device. Examples of such materials include, without limitation, GaN, ZnSe, AlGaInAs, GaAs, AlGaAs, InGaAs, GaInAsSb-AlGaAsSb, InAsSb-AlInAsSb, and InGaAsP. Preferably, first bottom DBR stack 102 is formed of GaAs, AlGaAs, and combinations thereof. The first bottom DBR stack 102 is made up of from about 40 to 100 individual layers, as is common in the production of VCSEL devices.

Specific illustrative examples of methods of fabricating first portion 101 include the following. One exemplary device useful as first portion 101 can be grown with molecular beam epitaxy (MBE) using thermally cracked arsenic (As). AlGaAs layers are formed by digital superlattices of AlAs and GaAs. In this example, first bottom DBR stack 102 includes about 18 pairs of layers of Si doped, quarter wave ($\lambda/4$) thick AlAs/GaAs linearly graded over 18 nm topped with a quarter wave layer of $Al_{0.9}G_{0.1}As$. These layers are grown at 600° C.

Figure 6:
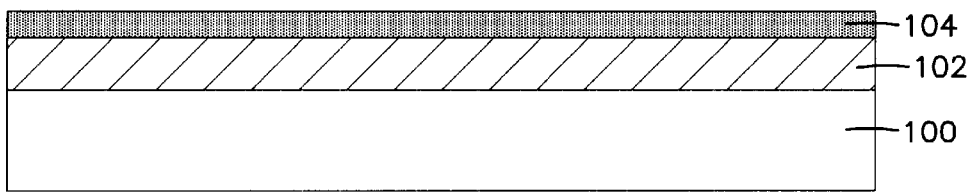

Referring to FIG. 6, active region 104 includes a 1-$\lambda$ $Al_{0.3}Ga_{0.7}$ spacer region centered around a region with three quantum wells with about 8 nm GaAs barriers. These layers are grown at about 530° C.

Figure 7:
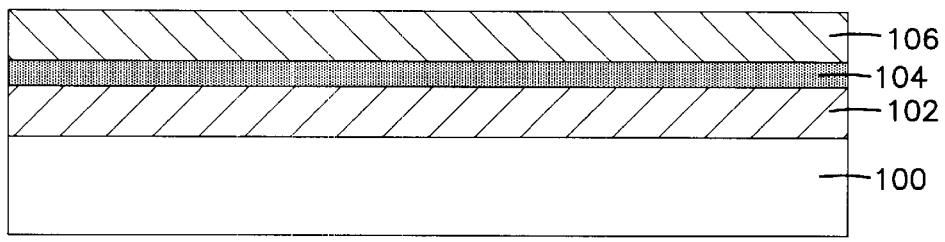

Referring to FIG. 7, first top DBR stack 106 contains a Be-doped mirror. First top DBR stack 106 begins with a ¾ $\lambda$ thick layer engineered for tapered oxidation and is followed by 29.5 layer pairs of $GaAs/Al_{0.67}As_{0.33}$ and a 46 nm GaAs layer that serves to compensate for the phase of the GaAs/Al reflection. First top DBR stack 106 is p-doped and is parabolically graded over 22 nm and step doped for lower voltages. The top 23 layer pairs of first top DBR stack 106 are grown at 500° C. with the remainder of first top DBR stack 106 grown at 600° C. A structure made in this fashion can also be modified to form a tapered aperture, which can then be used as first portion 101.

Figure 8:
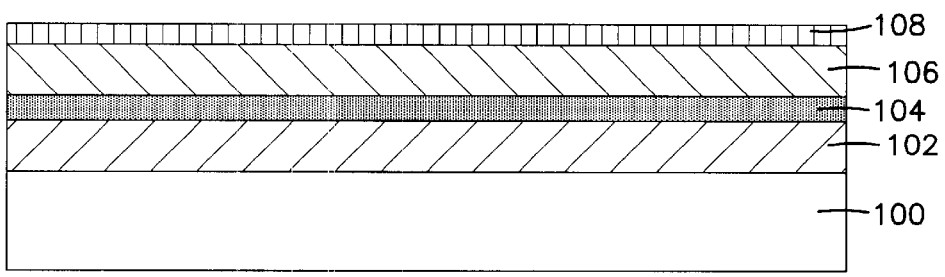

Referring to FIG. 8, spacer layer 108 is deposited next. The specific material utilized for the spacer layer 108 will play an important role in the method of producing a device of the invention as shown in FIG. 8. Spacer layer 108 can be formed from semiconductor material, a gap, a dielectric material, or the like.

If spacer layer 108 is formed from a semiconductor material, an entire device of the invention can be formulated by epitaxial growth on a single substrate. In this embodiment, the material for spacer layer 108 is grown on top of first portion 101, as seen in FIG. 8. The conditions for forming spacer layer 108 from a semiconductor material could be analogous to those of first portion 101. Second portion 103 is then grown thereon, as begun in FIG. 9, and proceeding through FIG. 11.

Figure 12:
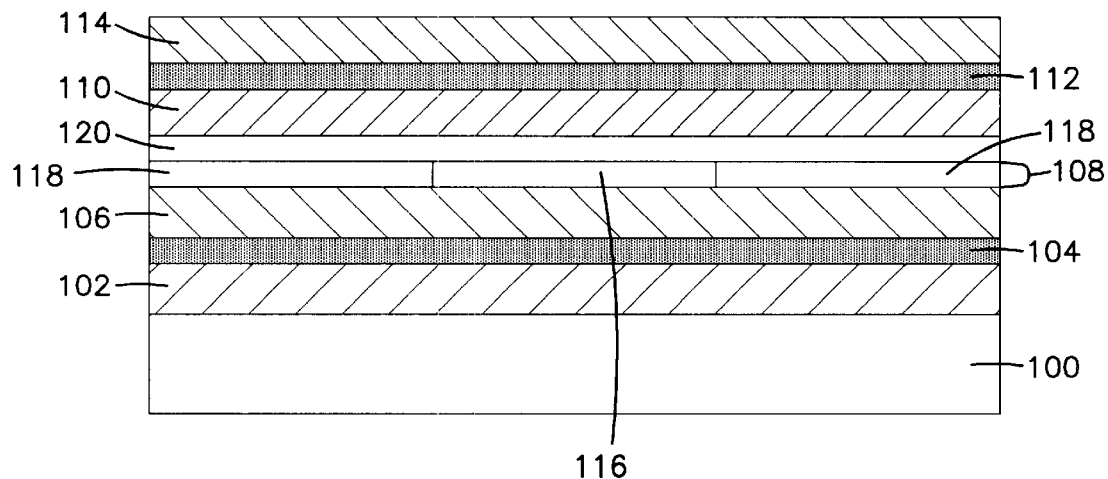
FIG. 12 is a cross-section of a device in accordance with the invention where the spacer layer 108 comprises a gap.

If spacer layer 108 is formed with a gap, first portion 101 is grown on substrate 100, second portion 103 is grown on second substrate 120, and first portion 101 and second portion 103 are then fused together to form spacer layer 108. In the alternative, first portion 101 could be grown, then an adhesive could be applied to the non-emitting portions of first portion 101, a gap formed, and then a substrate could be placed thereon to begin growth of second portion 103. The result of either of these methods can be seen in FIG. 12.

The fusion of first portion 101 and second portion 103 to create spacer layer 108 made of a gap could be accomplished by any method known to those of skill in the art, an example of which would be to use an optical polymer such as polyimide to secure first portion 101 to second portion 103. The gap 116 making up spacer layer 108, and the fixed spacers 118 forming the gap 116 can be seen in FIG. 12. The fixed spacers 118 can be any material that could function to maintain a gap 116 between first portion 101 and second portion 103, examples of which are an adhesive, physical structures made of metals, semiconductor materials, or other commonly used materials. Fixed spacers 118 can be formed by any method known to those of skill in the art.

Figure 13:
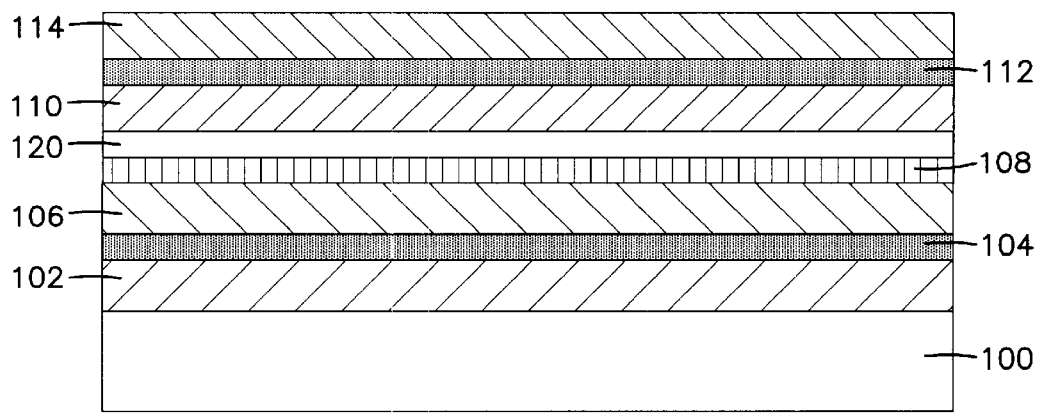
FIG. 13 is a cross-section of a device in accordance with the invention where the spacer layer 108 is a dielectric material.

If spacer layer 108 is formed with a dielectric material, first portion 101 is grown on substrate 100, second portion 103 is grown on second substrate 120, and first portion 101 and second portion 103 are then fused together either along with or though the action of the dielectric material. In the alternative, first portion 101 could be grown, then an adhesive and a dielectric or an adhesive dielectric would be applied to first portion 101, and then a substrate could be placed thereon (either with or without more adhesive depending on the nature of the dielectric) to begin growth of second portion 103. The result of either of these methods can be seen in FIG. 13.

When the spacer layer 108 is formed of a dielectric material, the method of production, and the resulting device depends in part, on the characteristics of the dielectric material chosen. For example, if the dielectric material has adhesive properties, it can function to transmit, spread the beam and hold the device together. Generally, any material that has dielectric and adhesive properties could be used to function in this manner, as long as it transmits light emitting from first portion 101. Nonlimiting examples of such dielectric materials include, polymers such as polyimide optical adhesives. Dielectric materials with these properties can be applied by any method known to those of skill in the art for utilizing that specific dielectric adhesive.

If the dielectric material that comprises spacer layer 108 does not have characteristics of an adhesive, the method of producing a device of the invention will generally be to form first portion 101, deposit an adhesive thereon (if it is transmissive of the emitting light, it can be applied over the entire surface of first portion 101, and if nontransmissive, it is only deposited on the non-emitting region of first portion 101), deposit a dielectric material, deposit adhesive on the dielectric material (similar constraint if not transmissive), and then either attach pre-fabricated second portion 103 or attach second substrate 120 and begin fabrication of second portion 103. Non-adhesive dielectric materials can be deposited by any method known to those of skill in the art, for example Metal Organic Chemical Vapor Deposition (MOCVD). The adhesive is then applied using standard methods that depend on the specific adhesive being utilized.

Referring again to FIGS. 9 through 11, second portion 103 is formed similarly to first portion 101, beginning with the formation of second bottom DBR stack 110. The relative characteristics of first bottom DBR stack 102 that were discussed above are also considered in the formation of second bottom DBR stack 110. Therefore, then the number of layers in second bottom DBR stack 110 would be less than that of first bottom DBR stack 102 by a predetermined percentage; amplifying region 112 would be more than that of active region 104 by a specified amount; and second top DBR stack 114 would be less than that of first top DBR stack 106 by a predetermined percentage.

Figure 9:
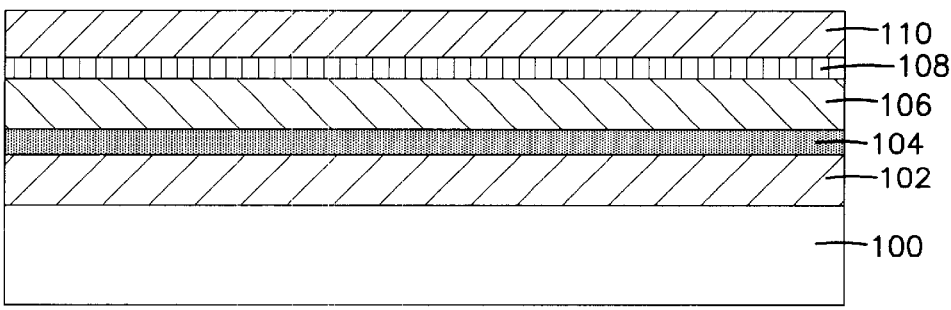

Specific illustrative examples of methods of fabricating second portion 103 include the following. An exemplary device useful as second portion 103 can be grown with molecular beam epitaxy (MBE) using thermally cracked arsenic (As). AlGaAs layers are formed by digital superlattices of AlAs and GaAs. Referring to FIG. 9, in this example, second bottom DBR stack 110 includes about 10 pairs of layers of Si doped, quarter wave ($\lambda/4$) thick AlAs/GaAs linearly graded over 18 nm topped with a quarter wave layer of $Al_{0.9}Ga_{0.1}As$. These layers are grown at about 600° C.

Figure 10:
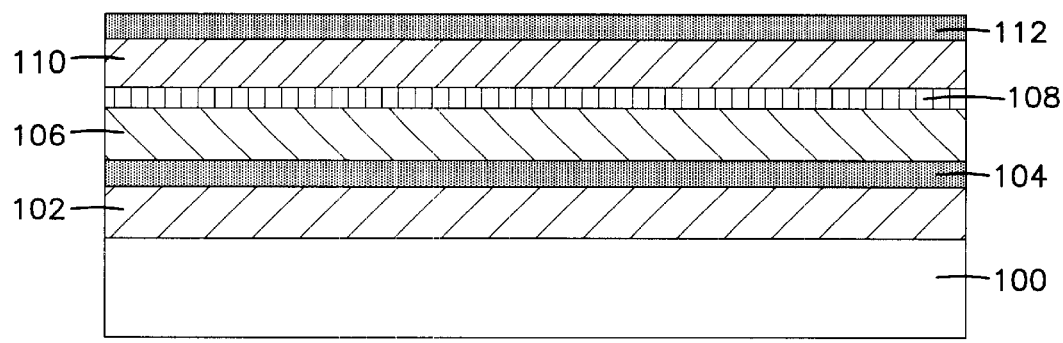

Referring to FIG. 10, amplifying region 112 includes a 1-$\lambda$ $Al_{0.3}Ga_{0.7}$ spacer region centered around a region with five quantum wells with 8 nm GaAs barriers. These layers are grown at about 530° C.

Figure 11:
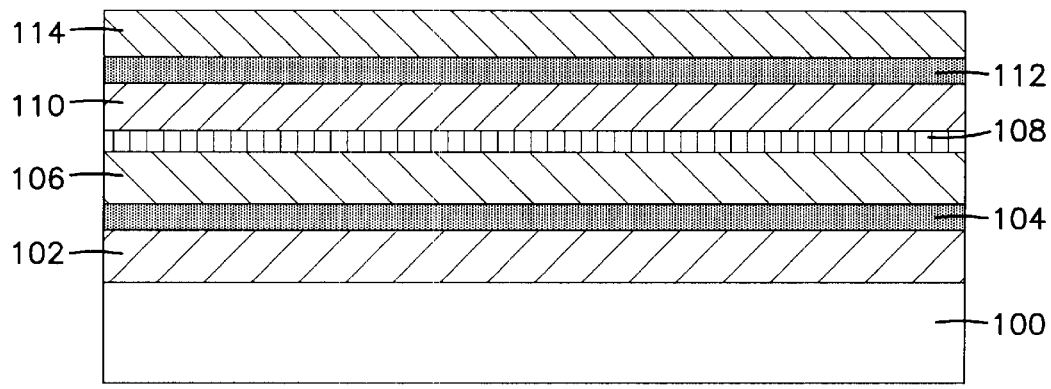

Referring to FIG. 11, second top DBR stack 114 contains a Be-doped mirror. Second top DBR stack 114 begins with a ¾ $\lambda$ thick layer engineered for tapered oxidation and is followed by about 15 layer pairs of $GaAs/Al_{0.67}As_{0.33}$ and a 46 nm GaAs layer that serves to compensate for the phase of the GaAs/Al reflection. Second top DBR stack 114 is p-doped and is parabolically graded over 22 nm and step doped for lower voltages. The top 8–12 layer pairs of second top DBR stack 114 are grown at about 500° C. with the remainder of second top DBR stack 114 grown at about 600° C.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A device comprising:
   a first portion comprising at least one first quantum well, wherein said first portion emits light;
   a spacer layer comprising a material having an index of refraction that functions to expand and transmit light emitted from said first portion; and
   a second portion comprising an amplifying region, wherein said amplifying region comprises at least one second quantum well;
   wherein said spacer layer is configured to transmit and expand said light beam emitted by said first portion and said amplifying region of said second portion is configured to increase the intensity of said light beam from said spacer layer.

2. The device of claim 1, wherein said amplifying region has an equal or greater number of quantum wells than said first portion.

3. The device of claim 2, wherein said amplifying region has mare quantum wells than said first portion.

4. The device of claim 1, wherein said first portion further comprises a first bottom Distributed Bragg Reflector stack and a first top Distributed Bragg Reflector stack.

5. The device of claim 4, wherein said second portion further comprises a second bottom Distributed Bragg Reflector stack and a second Distributed Bragg Reflector stack.

6. The device of claim 5, wherein said first portion has a higher reflectivity than said second portion.

7. The device of claim 1, wherein said spacer layer comprises a semiconductor material.

8. The device of claim 7, wherein said spacer layer is from about 60 to 100 $\mu$m thick.

9. The device of claim 1, wherein said spacer layer comprises a dielectric material.

10. The device of claim 9, wherein said spacer layer is secured between said first portion and said second portion.

11. The device of claim 10, wherein said spacer layer is secured between said first portion and said second portion by means of an adhesive.

12. The device of claim 10, wherein said spacer layer is secured between said first portion and said second portion by means of fusion bonding.

13. The device of claim 9, wherein said dielectric material has adhesive properties.

14. The device of claim 13, wherein said dielectric material with adhesive properties is a polyimide optical adhesive.

15. The device of claim 1, wherein said spacer layer comprises an air gap.

16. The device of claim 15, wherein said spacer layer is from about 15 to 25 $\mu$m thick.

17. The device of claim 1, wherein said spacer layer comprises a polymer.

18. The device of claim 17, wherein said spacer layer is from about 25 to 45 $\mu$m thick.

19. The device of claim 1, wherein said spacer layer is from about 1 to 500 $\mu$m thick.

20. The device of claim 1, wherein said spacer layer is from about 10 to 100 $\mu$m thick.

21. A method of manufacturing a vertical cavity surface emitting laser comprising the steps of:

forming a first portion that emits light, comprising at least one first quantum well;

forming a spacer layer comprising a material that is transmissive and expansive of light emitted from said first portion;

forming a second portion comprising at least one second quantum well;

wherein said second portion is positioned over said spacer layer and said spacer layer is positioned over said first portion.

22. The method of claim 21, wherein said first portion is formed on a first substrate, and said second portion is formed on a second substrate.

23. The method of claim 22, further comprising the step of securing said first portion to said second portion.

24. The method of claim 21, further comprising the step of forming fixed spacers on the top surface of said first portion.

* * * * *